(12) United States Patent
Zhang et al.

(10) Patent No.: US 12,007,687 B2
(45) Date of Patent: Jun. 11, 2024

(54) MICROFLUIDICS-ENABLED MULTIMATERIAL STEREOLITHOGRAPHIC PRINTING

(71) Applicants: THE BRIGHAM AND WOMEN'S HOSPITAL, INC., Boston, MA (US); PRESIDENT AND FELLOWS OF HARVARD COLLEGE, Cambridge, MA (US)

(72) Inventors: Yu Shrike Zhang, Malden, MA (US); Ali Khademhosseini, Los Angeles, CA (US)

(73) Assignee: THE BRIGHAM AND WOMEN'S HOSPITAL, INC., Boston, MA (US)

( * ) Notice: Subject to any disclaimer, the term of this patent is extended or adjusted under 35 U.S.C. 154(b) by 0 days.

(21) Appl. No.: 18/324,452

(22) Filed: May 26, 2023

(65) Prior Publication Data
US 2023/0359117 A1    Nov. 9, 2023

Related U.S. Application Data

(62) Division of application No. 16/660,956, filed on Oct. 23, 2019, now Pat. No. 11,693,311.
(Continued)

(51) Int. Cl.
| | |
|---|---|
| *B29C 64/00* | (2017.01) |
| *B22F 10/00* | (2021.01) |
| *B22F 10/85* | (2021.01) |
| *B22F 12/00* | (2021.01) |
| *B22F 12/82* | (2021.01) |
(Continued)

(52) U.S. Cl.
CPC .............. *G03F 7/001* (2013.01); *B22F 10/00* (2021.01); *B22F 10/85* (2021.01); *B22F 12/00* (2021.01); *B22F 12/82* (2021.01); *B29C 64/00* (2017.08); *B29C 64/10* (2017.08); *B29C 64/106* (2017.08); *B29C 64/176* (2017.08); *B29C 64/182* (2017.08); *B29C 64/20* (2017.08); *B29C 64/205* (2017.08); *B29C 64/227* (2017.08); *B29C 64/245* (2017.08); *B29C 64/25* (2017.08); *B29C 64/255* (2017.08); *B29C 64/30* (2017.08); *B29C 64/307* (2017.08); *B29C 64/386* (2017.08); *B29C 64/393* (2017.08); *B29C 64/40* (2017.08); *B33Y 10/00* (2014.12); *B33Y 30/00* (2014.12); *B33Y 40/00* (2014.12); *B33Y 40/10* (2020.01); *B33Y 40/20* (2020.01); *B33Y 50/00* (2014.12); *B33Y 50/02* (2014.12); *B33Y 70/00* (2014.12); *B33Y 80/00* (2014.12); *B33Y 99/00* (2014.12); *G03F 7/00* (2013.01)

(58) Field of Classification Search
CPC ............................ G03F 7/001; B33Y 10/00
See application file for complete search history.

(56) References Cited

U.S. PATENT DOCUMENTS

2015/0119284 A1\* 4/2015 Kwon .................... G01N 33/94
506/28

\* cited by examiner

*Primary Examiner* — Nicholas R Krasnow
(74) *Attorney, Agent, or Firm* — TAROLLI, SUNDHEIM, COVELL & TUMMINO L.L.P.

(57) ABSTRACT

Described are systems and methods for multi-material printing. The systems and methods can utilize a stereolithographic printing device, a moving stage, and a microfluidic device. The microfluidic device can include a plurality of reservoirs, each reservoir housing a different ink for printing, and a microfluidic chip. The microfluidic chip can include a chamber that comprises a plurality of inlets, a printing region, and one or more outlets as well as an elastic membrane.

6 Claims, 11 Drawing Sheets

Related U.S. Application Data

(60) Provisional application No. 62/749,318, filed on Oct. 23, 2018.

(51) Int. Cl.
*B29C 64/10* (2017.01)
*B29C 64/106* (2017.01)
*B29C 64/176* (2017.01)
*B29C 64/182* (2017.01)
*B29C 64/20* (2017.01)
*B29C 64/205* (2017.01)
*B29C 64/227* (2017.01)
*B29C 64/245* (2017.01)
*B29C 64/25* (2017.01)
*B29C 64/255* (2017.01)
*B29C 64/30* (2017.01)
*B29C 64/307* (2017.01)
*B29C 64/386* (2017.01)
*B29C 64/393* (2017.01)
*B29C 64/40* (2017.01)
*B33Y 10/00* (2015.01)
*B33Y 30/00* (2015.01)
*B33Y 40/00* (2020.01)
*B33Y 40/10* (2020.01)
*B33Y 40/20* (2020.01)
*B33Y 50/00* (2015.01)
*B33Y 50/02* (2015.01)
*B33Y 70/00* (2020.01)
*B33Y 80/00* (2015.01)
*B33Y 99/00* (2015.01)
*G03F 7/00* (2006.01)

MICROFLUIDICS-ENABLED MULTIMATERIAL STEREOLITHOGRAPHIC PRINTING

RELATED APPLICATION

This application is a divisional of U.S. patent application Ser. No. 16/660,956, filed on Oct. 23, 2019, which claims the benefit of U.S. Provisional Application No. 62/749,318, filed Oct. 23, 2018. The entirety of these applications are hereby incorporated by reference for all purposes.

TECHNICAL FIELD

The present disclosure relates generally to systems and methods for multi-material printing including multi-material bioprinting.

BACKGROUND

Three dimensional (3D) printing is an additive manufacturing method that can be used to create a wide variety of objects. In some instances, 3D printing can produce objects that cannot otherwise be created using traditional manufacturing processes. For example, in stereolithography, to create an object using a 3D printer, a layer of material is deposited, for example, photochemically solidified across a 2D plane, and then another layer of material is deposited on top of the previous layer. This process is repeated multiple times until the final object is obtained.

One particular type of 3D printing is 3D bioprinting where biological materials are incorporated into the inks used for printing. It has been found that bioprinting can be used to fabricate biomedical constructs, such as artificial tissues, tissue models, functional biomaterials, biomolecules, biomedical devices, scaffolds, and the like. 3D bioprinting is useful because existing manufacturing methods such as freeze-drying and salt-leaching lack flexibility to tune the design regionally.

Although strides have been made to improve 3D bioprinting, several key challenges remain, including the continuous fabrication of cell-laden constructs with clinically relevant dimensions and the inability to bioprint multicomponent complex constructs with high precision. Additionally, a core challenge has involved managing material delivery when using multiple materials to fabricate the constructs.

SUMMARY

The present disclosure relates generally to systems and methods for multi-material printing and, more particularly, to systems and methods for multi-material bioprinting. Notably, the systems and methods of the present disclosure can utilize a stereolithographic printing device to rapidly fabricate biological constructs with high precision and with clinically relevant dimensions.

In one aspect, the present disclosure can include a 3D printing system. The 3D printing system can include a stereolithographic printing device, a moving stage, and a microfluidic device where the microfluidic device can include a plurality of reservoirs, each reservoir housing a different ink for printing, and a microfluidic chip.

In another aspect, the microfluidic chip comprises a chamber, wherein the chamber comprises a plurality of inlets, a printing region, and one or more outlets. In one instance the chamber is comprised of a polydimethylsiloxane (PDMS) polymer.

In a further aspect, the reservoirs housing the inks can be individually connected to a respective inlet present on the microfluidic chip.

In another aspect, the microfluidic chip can include an elastic membrane. The elastic membrane can be bonded to the chamber. Furthermore, the elastic membrane can, for example, be made out of a PDMS polymer.

In a further aspect, the chamber bonded to the elastic membrane is sandwiched between two polymer sheets. The two polymer sheets can be, for example, comprised of poly(methyl methacrylate) (PMMA).

In an additional aspect, the printing device can comprise a digital micromirror device (DMD).

In another aspect, each reservoir is connected to a pneumatic valve wherein the pneumatic valves are each connected to a container comprising a gas.

In yet a further aspect, the inks used in the stereolithographic printing system can include gelatin methacryloyl (GelMA) and poly(ethylene glycol) diacrylate (PEGDA). Additionally, the inks can include biologically active components such as biomaterials, cells, growth factors, cytokines, anti-infection agents, adhesive molecules, and nanoparticles.

In another aspect, the present disclosure can include a method of printing a multi-material 3D construct comprising providing a plurality of inks; releasing at least one first ink into a microfluidic chip wherein the microfluidic chip comprises (i) a chamber, wherein the chamber further comprises a printing region for holding the ink to be printed; (ii) a deposition layer, and (iii) an elastic membrane; causing the elastic membrane to deform; photocrosslinking the first ink in the printing region onto the deposition layer to form a first printed layer; reducing the deformation of the elastic membrane; washing the chamber; and releasing at least one second ink into the microfluidic chip to produce a second printed layer.

In a further aspect, the chamber is washed using the second ink. In another aspect, the chamber is washed using a buffer.

In yet another aspect, one of the first or second inks can comprise a biologically active component, wherein the biological active component is selected from biomaterials, cells, growth factors, cytokines, anti-infection agents, adhesive molecules, and nanoparticles.

In another aspect, the first and second inks can both comprise a biologically active component, wherein the biological active component is selected from biomaterials, cells, growth factors, cytokines, anti-infection agents, adhesive molecules, and nanoparticles.

In yet another aspect, two or more first inks are released into the microfluidic chip

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

Definitions

Figure 1:
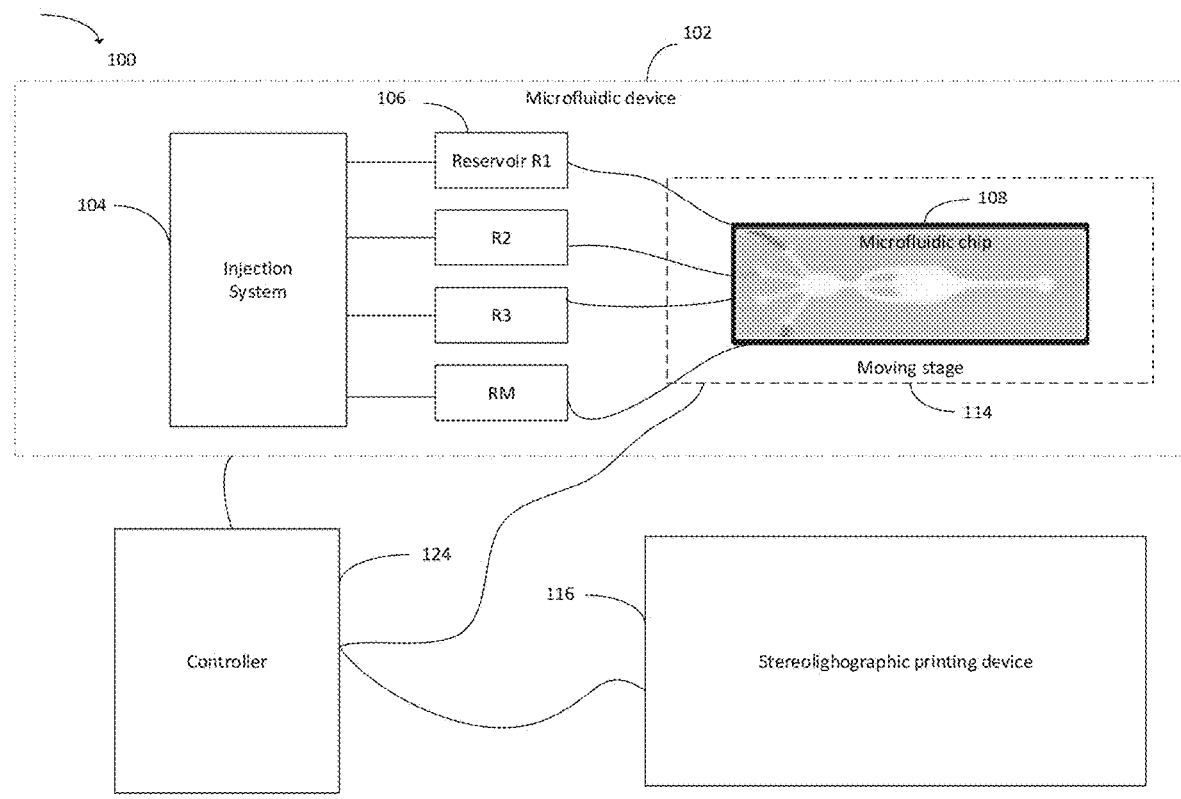
FIG. 1 is a block diagram illustrating an example of a system for multi-material printing according to an aspect of the present disclosure.

In the context of the present disclosure, the singular forms "a," "an" and "the" can also include the plural forms, unless the context clearly indicates otherwise.

The terms "comprises" and/or "comprising," as used herein, can specify the presence of stated features, steps, operations, elements, and/or components, but do not preclude the presence or addition of one or more other features, steps, operations, elements, components, and/or groups.

As used herein, the term "and/or" can include any and all combinations of one or more of the associated listed items.

Additionally, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or acts/steps) is not limited to the order presented in the claims or figures unless specifically indicated otherwise.

As used herein, the term "bioprinting" can refer to a method of biofabrication using a printer to print materials incorporated with living cells or structures that are used for culturing cells or for tissue interactions. Bioprinting can include two-dimensional (2D) bioprinting and three-dimensional (3D) bioprinting.

As used herein, the term "2D bioprinting" can refer to a particular means of fabrication of planar biomedical constructs. For example, 2D bioprinting can refer to the deposition of a single layer of microdroplets or photochemically solidifying material to create a planar biomedical construct.

As used herein, the term "3D bioprinting" can refer to a particular means of fabrication of 3D biomedical constructs. As an example, 3D bioprinting can refer to particularly processes where successive layers or rows of microdroplets or material are deposited or photochemically solidified under computer control to create the 3D biomedical construct. As an example, a 3D biomedical construct can include a complex biological structure comprising one or more independent three-dimensional constructs.

As used herein, the term "biomedical construct" can refer to a combination of one or more bioprinted materials that incorporate visible living cells. Examples of biomedical constructs include artificial tissues, tissue models, functional biomaterials, biomolecules, biomedical devices (e.g., including multiple components like bioelectronics and high-throughput point-of-care devices), scaffolds, and the like. In some instances, biomedical constructs can be planar 2D structures fabricated via 2D bioprinting. In other instances, biomedical constructs can be 3D structures fabricated via 3D bioprinting.

As used herein, the term "bioink" can refer to a fluid, solid, or hydrogel deposited by a bioprinter. The composition of the bioink can include one or more biological active components, like biomaterials, cells, growth factors, cytokines, anti-infection agents, adhesive molecules, nanoparticles, or the like.

As used herein, the terms "subject" and "patient" can be used interchangeably to refer to any warm-blooded living organism including, but not limited to, a human being, a pig, a rat, a mouse, a dog, a cat, a goat, a sheep, a horse, a monkey, an ape, a rabbit, a cow, etc.

Overview

The present disclosure relates generally to multi-material printing. The use of multiple inks to print 3D constructs has traditionally been problematic due to the time and labor it takes to switch between inks and to decontaminate the system. Additionally, with specific regard to bioprinting, traditionally employed techniques have numerous disadvantages. The traditional techniques do not allow for the precise fabrication of multicomponent constructs. The instant printer system overcomes these disadvantages. It has been found that integrating a microfluidic device into the design of a stereolithographic printing device allows for an automated multi-material stereolithographic printing system that is fast and provides constructs at high fidelity. In some instances, the multi-material printer system can be used to generate constructs for biological in vivo use.

Systems

FIG. 1 illustrates a system 100 for multi-material printing in which a plurality of inks can be delivered in a continuous manner for rapid fabrication of constructs, including biological constructs. The system 100 can include a microfluidic device 102. In one example, the microfluidic device can include an injection system 104, a plurality of reservoirs 106 (R1-RM, where M is an integer greater than 1), and a microfluidic chip 108. The injection system 104 can be connected to the reservoirs 106.

Figure 2:
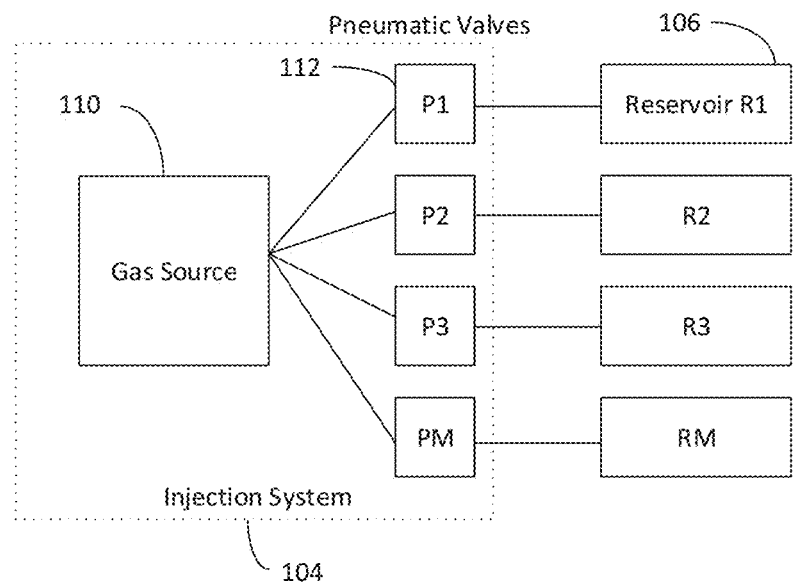
FIG. 2 is a block diagram illustrating an example of an injection system that can be used in connection with the system of FIG. 1.

Exemplary injection systems 104 include those based on various mechanisms including a pneumatic pressure change, a mechanical pressure change, a thermal activation, and a piezo electric activation. In some instances a combination of mechanisms may be used. In one specific example, the injection system can be based on a pneumatic pressure change. FIG. 2 illustrates an injection system that includes a gas source 110 and a plurality of pneumatic values 112 (P1-PM, where M is an integer greater than 1), where the pneumatic values are individually connected to reservoirs 106.

Each of the plurality of reservoirs 106 shown in FIG. 1 can include an ink for printing. In some instances, each of the reservoirs can include a different and unique ink. In other instances, two or more of the reservoirs can include the same ink. The ink may be comprised of any material that is able to be photocrosslinked. Exemplary inks include hydrogel inks such as GelMA and PEGDA. Additionally, commercially available resins can be used. In some instances the ink can include one or more biologically active components. The biological active components can include biomaterials, cells, growth factors, cytokines, anti-infection agents, adhesive molecules, and nanoparticles. In some instances, dyes and fluorescence beads may be included in the inks to assist in visualization. Additionally, in some instances, photoabsorbers can be included in the inks.

In further instances, one or more of the reservoirs 106 can contain a washing solution. For example, the washing solution may be a buffer solution such as a phosphate-buffered saline solution. A washing solution can be used when a previously used ink is hard to remove from the system. In instances when the ink is not difficult to remove the system, the inks may be used sequentially. In this instance the later used ink can wash out the previously used ink from the system.

The reservoirs 106 can be connected to a microfluidic chip 108. Microfluidic chip 108 will be discussed in greater detail below with regard to FIG. 4.

Microfluidic chip 108 can be positioned on a moving stage 114. The moving stage 114 can move in three directions (e.g., along the x, y, and z axes).

The system 100 can also include a stereolithographic printer (SLP) device 116. Exemplary SLP devices include a digital light processing device (DLP) and a digital micromirror device (DMD). DMD-based projection printing has emerged as a high-throughput DLP technique offering biocompatibility for cell seeding and encapsulation. DMD is a micro-electro-mechanical system that enables a user to control over one million small mirrors to turn-on or turn-off on the order of kHz. An UV lamp projects light on the DMD panel, in which patterns the image of each layer of the computer-aided-design (CAD) model, and projects into the bottom side of the container. Following this UV exposure, the photosensitive polymer or hydrogel crosslinks and attaches to the previous layer. DMD-based printing offers high-quality surface finishing and a variety of material options.

Figure 3:
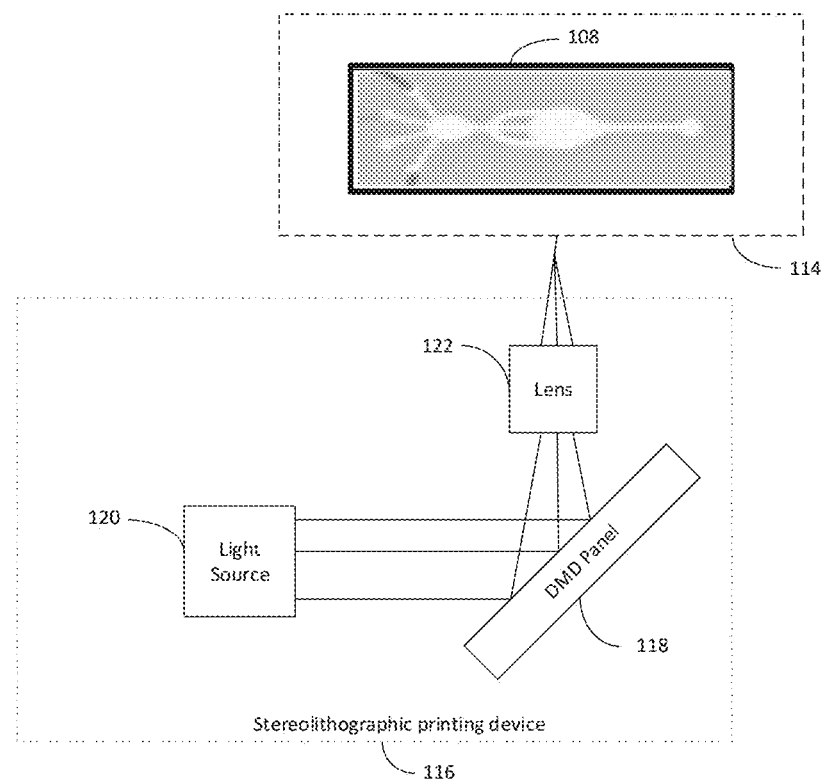
FIG. 3 is a block diagram illustrating an example of a stereolithographic printing device that can be used in connection with the system of FIG. 1.

In the instance that the SLP device 116 includes a DMD, FIG. 3 shows that the DMD can include a DMD panel 118 and a light source 120. In some instances the light source 120 is a UV source or a visible light source. In certain instances the light source is an LED source. Additionally, in some instances one or more lens' 122 may be used to affect the focal length or resolution of the constructs being printed. In one instance, the light source can be directed via an optical path toward the DMD panel at specific angles to facilitate light reflection to the stage through the lens.

The SLP device 116, the moving stage 114, and the microfluidic device 102 can be coupled to a controller 124. In some instances the controller 124 can be a master controller coupled to one or more subcontrollers. In one instance the controller 124 may include a CAD and computer-aided manufacturing (CAD/CAM) system to, for example, design the products to be created or convert images to a product design, control the reservoirs 106, control the moving stage 114, and control the SLP device 116. Such CAD/CAM systems are known to those skilled in the art and can be implemented in combination with the present disclosure in accordance with known techniques or variations thereof that will be apparent to those skilled in the art.

Figure 4:
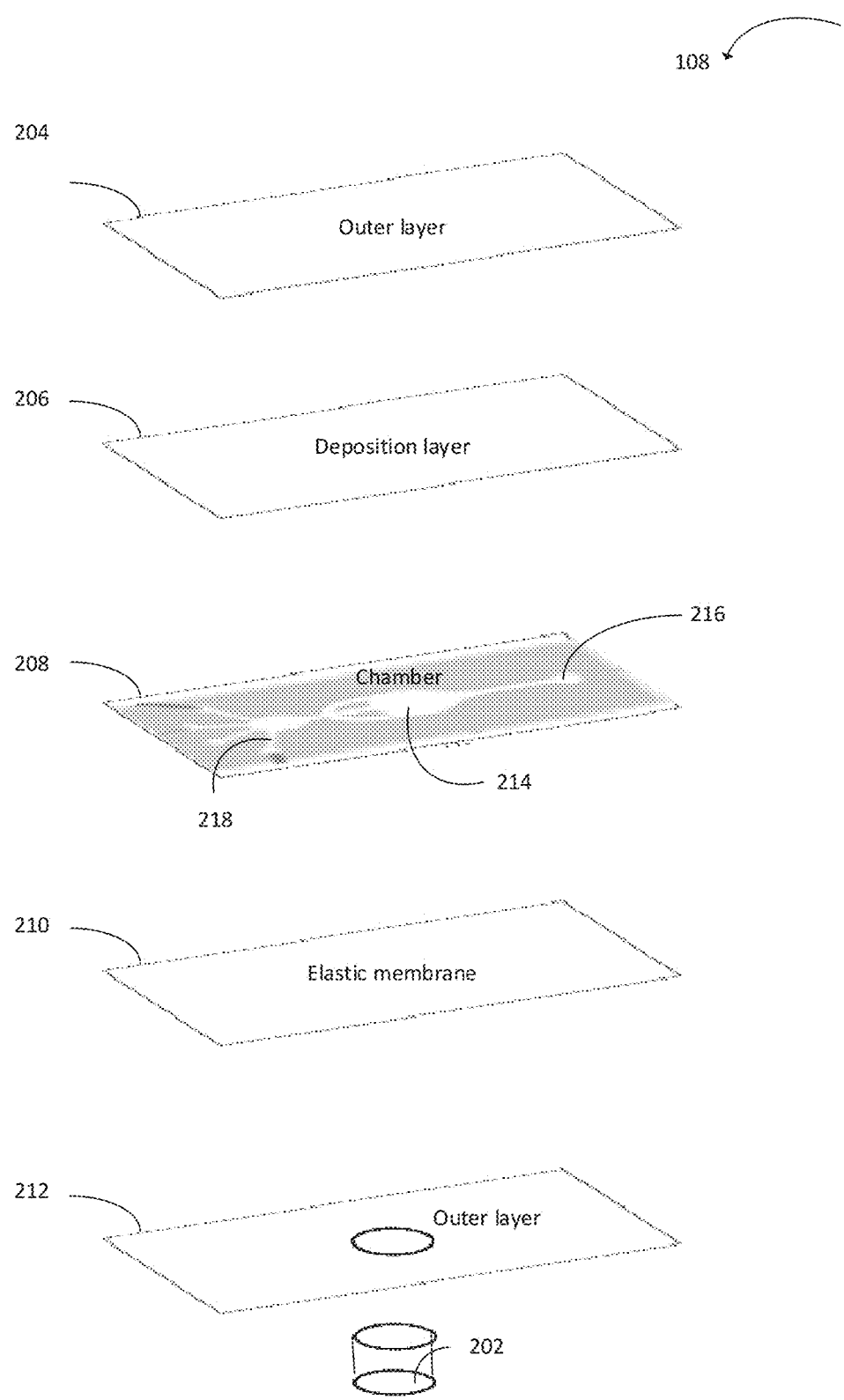
FIG. 4 is a block diagram illustrating an example of microfluidic chip that can be used in connection with the system of FIG. 1.

FIG. 4 illustrates a microfluidic chip 108. Beneath the microfluidic chip 108 a tower 202 can be present.

The microfluidic chip 108 can be comprised of multiple layers. For example, the microfluidic chip 108 may be comprised of five layers, including two outer layers 204 and 212, a deposition layer 206, a chamber 208, and an elastic membrane 210. As seen in FIG. 2, outer layer 212 can have a section removed so that the tower 202 can fit through the removed section. In some cases, the microfluidic chip 108 can be comprised of three layers, including a deposition layer 206, a chamber 208, and an elastic membrane 210.

Chamber 208 can include a plurality of inlets 218 through which the various inks can flow. For example, there may be two, three, four, five, or six inlets. The plurality of inlets allows for sequential injection of different inks. The chamber 208 can also include a printing region 214. The printing region is the section of the chamber where the ink to be photocrosslinked and printed resides. Additionally, the chamber can have one or more outlets 216 through which the ink being washed out of the system can be discarded, recirculated, or reused.

The elastic membrane 210 can be bonded to chamber 208 through, for example, chemical bonding or mechanical force. The elastic membrane 210 can function to seal the chamber 208. For example, during the printing process ink can be ejected from reservoir 106 into the chamber 208 and into printing region 214. In one instance, the microfluidic chip 108 can then be lowered such that the tower 202 comes in contact with the elastic membrane 210. This contact can result in the deformation of the elastic membrane, and the degree of contact can provide the designated thickness for the layer to be photocrosslinked. The ink in the printing region 216 can then be photocrosslinked. After the ink has been photocrosslinked, the microfluidic chip 108 can be raised which can reduce the deformation of the elastic membrane 210. The ink can then be washed from the system. In another instance, when the ink is ejected from reservoir 106 into chamber 208, the tower 202 can already be at an elevated position and the elastic membrane 210 can already be deformed to the level needed to achieve the designated thickness of the photocrosslinked layer. The ink can then be photocrosslinked, and the tower 202 can be lowered which can reduce the deformation of the elastic membrane 210. The ink can then be washed from the system.

Tower 202 can be made out of any optically transparent material. For example, tower 202 can be made of glass, plastic, or elastomer that is optically transparent. In one instance, tower 202 can be made of a polymer such as PMMA, PDMS, or polystyrene. In one instance, the tower 202 is hollow. In another instance, the tower 202 is not hollow.

Outer layers 204 and 212, deposition layer 206, and chamber 208 can be made out of any suitable material, such as glass, plastic, or elastomer. In one instance, the outer layers 204 and 212 can be polymer sheets. The polymer can be, for example, PMMA, PDMS, or polystyrene. In one particular example, the outer layers 204 and 212 can be PMMA sheets. In another instance, the deposition layer 206 can be a glass sheet. In a further instance, chamber 208 can be a PDMS sheet.

The elastic membrane 210 can be made out of an optically transparent flexible material. In one instance the elastic membrane 210 material is oxygen permeable. In certain instances the elastic membrane 210 can be made out of a polymer such as polybutylene adipate terephthalate (PBAT) or PDMS. The elastic membrane can also be made of a plastic such as thermoplastic polyurethane or Teflon® AF 2400. In one particular instance, the elastic membrane 210 is a PDMS membrane.

In another aspect, a mixer can be used to mix two or more inks together. In one instance the mixer can be included in microfluidic chip 108. For example, the mixer may be placed in chamber 208 prior to reaching printing region 214. In another instance, the mixer can be placed between reservoirs 106 and microfluidic chip 108. The mixer can be a microchannel mixing device. For example, the mixer may be designed in the manner disclosed by Stroock et al., Chaotic Mixer for Microchannels, Science, 295:647-51 (Jan. 25, 2002) where patterned groves on the floor of a channel are utilized.

One skilled in the art would understand that other configurations of the system 100 can be used to print 3D constructs. For example, the printed construct can be fabricated using a bottom up approach where the microfluidic chip 108 is positioned below the SLP device 116.

Methods

Figure 5:
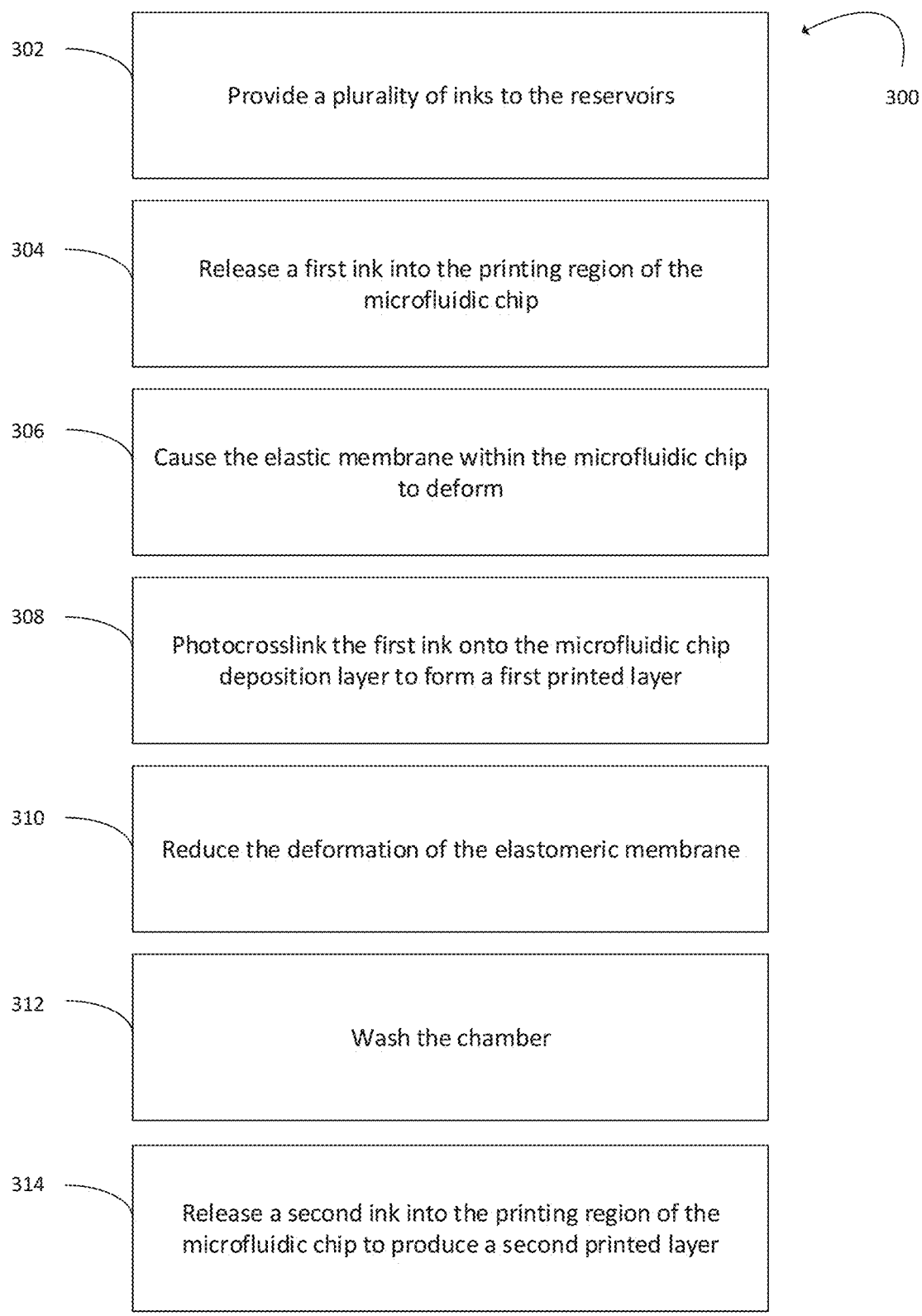
FIG. 5 is a process flow diagram of an example method for multi-material printing according to another aspect of the present disclosure.

Another aspect of the present disclosure can include a method 300 (FIG. 5) for multi-material printing. The multi-material printing can be accomplished, for example, by the system 100 of FIG. 1. The method 300 of FIG. 5 is illustrated as a process flow diagram. For purposes of simplicity, the method 300 is shown and described as being executed serially; however, it is to be understood and appreciated that the present disclosure is not limited by the illustrated order as some steps could occur in different orders and/or concurrently with other steps shown and described herein. Moreover, not all illustrated aspects may be required to implement the method 300.

FIG. 5 illustrates a method 300 for multi-material printing. At 302, a plurality of inks can be provided to reservoirs 106. At 304, a first ink can then be released from reservoir 106 into the microfluidic chip 108 using the injection system 104. In some instances more than one ink can be released at a time. In even further instances, when more than one ink is released, the inks can be mixed before or after they arrive at microfluidic chip 108. Within microfluidic 108, the ink to be printed can be held in the printing region 214 of chamber 208. Chamber 208 can have an elastic membrane 210 bound to it.

At 306, the elastic membrane 210 can become deformed. For example, microfluidic chip 108 can be lowered such that the tower 202 comes in contact with the elastic membrane 210. This contact can result in the deformation of the elastic membrane and the degree of contact can provide the designated thickness for the layer to be photocrosslinked. In another example, the tower 202 can be raised such that it comes into contact with the elastic membrane 210 causing the elastic membrane 210 to deform. The degree of contact between the tower 202 and elastic membrane 210 can provide the designated thickness for the layer to be photocrosslinked. In some instances, the tower 202 can already be raised and the elastic membrane 210 can already be deformed before the ink is released into the printing region 214 of microfluidic chip 108.

At 308, the ink in the printing region 214 can then be photocrosslinked using the SLP device 116. The photocrosslinked ink can be deposited onto the deposition layer 206 to form a first printed layer.

At 310, after the ink has been photocrosslinked, the microfluidic chip 108 can be raised which can reduce the deformation of the elastic membrane 210. The degree that the microfluidic chip 108 is raised can be based on the amount of space that is needed to efficiently remove the ink from the system. In another instance, the tower 202 can be lowered which can reduce the deformation of the elastic membrane 210. The degree that the tower 202 is lowered can be based on the amount of space that is needed to efficiently remove the ink from the system. In even further instances, the position of the microfluidic chip 108 and tower 202 can remain the same.

At 313, the ink can then be washed from the system including chamber 208. In one instance, the chamber 208 is washed using the next ink to be printed. In another instance, the chamber 208 is washed using a buffer.

At 314, a second ink can be released from reservoir 106 into the microfluidic chip 108 to produce a second printed layer. In certain instances, more than one second ink can be released from reservoirs 106 into the microfluidic chip 108. In instances when more than one ink is released, the inks can be mixed before or after they arrive at microfluidic chip 108.

The process starting at either 302 or 304 can then be repeated until the construct is fabricated.

The first or second inks can comprise one or more biologically active components. Exemplary biologically active components include biomaterials, cells, growth factors, cytokines, anti-infection agents, adhesive molecules, and nanoparticles.

The 3D printers described herein can be used to in a variety of applications including tissue engineering, regenerative medicine, and biosensing. For example, the 3D printers described herein can be used to prepare musculoskeletal systems, to prepare biomimetic cancer models, and to prepare implants for in vivo use.

In one particular instance the 3D printers can be used to prepare implants that stimulate angiogenesis in vivo. The method can include preparing an implant using the method described above where one or more of the inks includes VEGF. The implant can then be inserted into the body of a subject and the ability of the implant to stimulate angiogenesis can be monitored.

Experimental

The following example is shown for the purpose of illustration only and is not intended to limit the scope of the appended claims. This example illustrates that the integration of a simple microfluidic platform can advance the DMD-based bioprinter for proper fabrication of inhomogeneous constructs at high fidelity. The microfluidic platform allowed for integration of multiple independent bioink injections and further offered easy feeding of different materials with fast switching. Computational fluid dynamics was used to assess the performance of the microfluidic system for multi-material patterning. Various patterns were fabricated through this platform to validate its multi-material bioprinting capability. The flexibility and biocompatibility of the platform to generate biomimetic heterogeneous tissue constructs was further evaluated by using bioinks loaded with multiple cell types, introduced from the microfluidic chips into the DMD bioprinter.

Bioprinting System

Figures 6A, 6B, 6C:
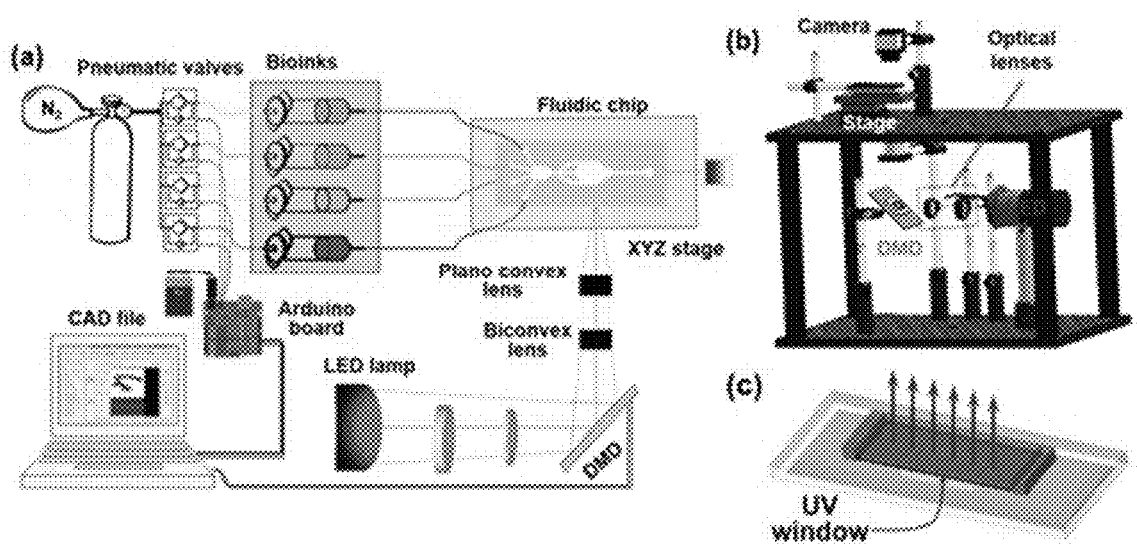
FIGS. 6a-6c provides schematics showing the setup of a system for multi-material bioprinting; (a) provides planar schematics showing the setup of the bioprinter, including an ultraviolet (UV) lamp (385 nm), optical lenses and objectives, a DMD chip, and a microfluidic device; (b) provides a schematic showing the actual setup of the entire optical platform; (c) provides a schematic showing an open-chamber microfluidic chamber used to create single-material printouts.
Figures 7A, 7B, 7C, 7D, 7E, 7F:
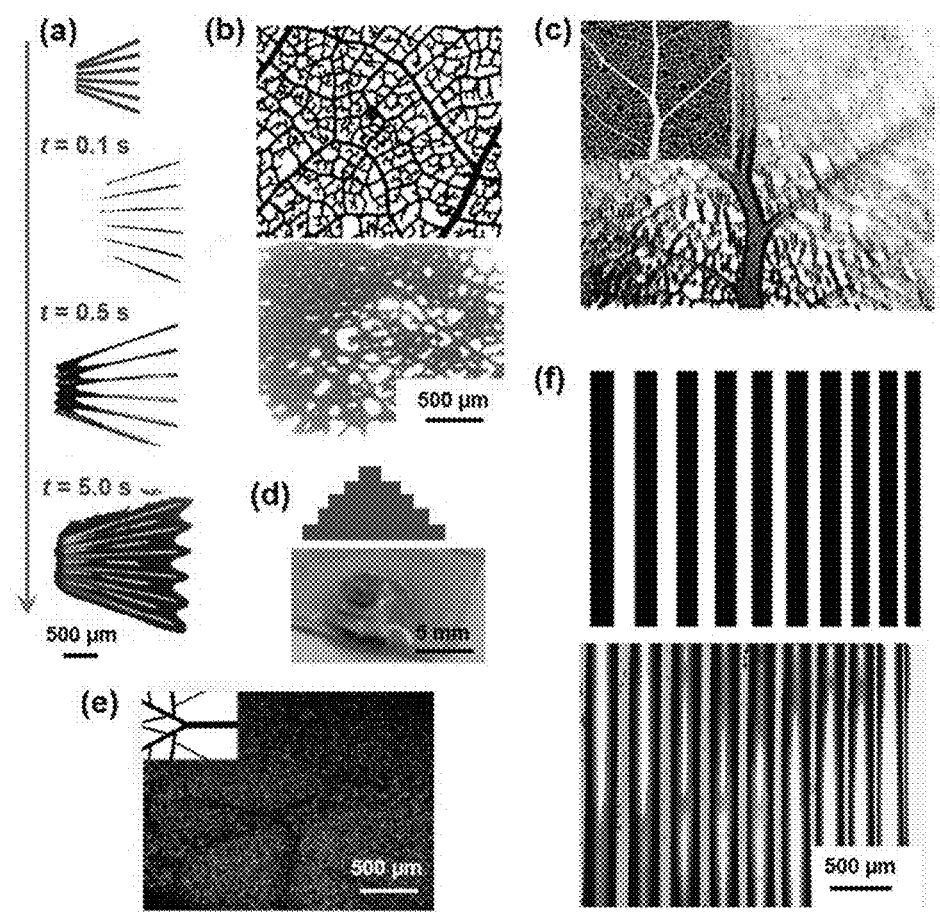
FIGS. 7a-7f provides examples of PEGDA-50% constructs printed by the open-chamber setup; (a) shows the role of UV exposure time on regulating the bioprinting resolution: oblique lines printed for different UV-exposure durations; (b) and (c) show a 2D resolution assessment by printing tree-like structures; (d) provides a bioprinted sample 3D construct; (e) provides a bioprinted two-material construct made by manually washing the first ink and adding the second ink; (f) shows a resolution map by printing thin lines at an UV intensity of 100 mW cm$^2$.

The DMD-based bioprinter uses UV light (up to 500 mW/cm$^2$) to polymerize a liquid pre-polymer towards a solid structure (FIG. 6). The DMD panel that is an array of reflective-coated micro-mirrors creates light patterns at high definition (i.e. 1050×920) and speed (10 kHz rate of switching). The digital state of each micro-mirror can be controlled as being either 0 (dark) or 1 (light-reflecting for photopolymerization) while the bioink is introduced to the focal plane of the projected image, leading to its crosslinking in a layer-by-layer fashion. The image size was calibrated by printing a single image featuring a grid pattern, and then measuring the grid by a light microscope. The lateral resolution is theoretically limited by the physical size of DMD mirrors, which is 7.6 μm for the selected model; however, experimental printing resolution (i.e., smallest feature size) was determined at the order of 10 μm (FIG. 7). Simple patterns were used to show printing capabilities of our DMD-based bioprinter over a range of UV exposure parameters and photoinitiator concentrations. The photoinitiator concentration affected the time required to fully crosslink the hydrogel from seconds to minutes. The practical resolution of our bioprinter was further shown by printing parallel lines, in which it generated a line thickness down to ~25 μm (FIG. 7f).

Figures 8A, 8B, 8C, 8D, 8E, 8F:
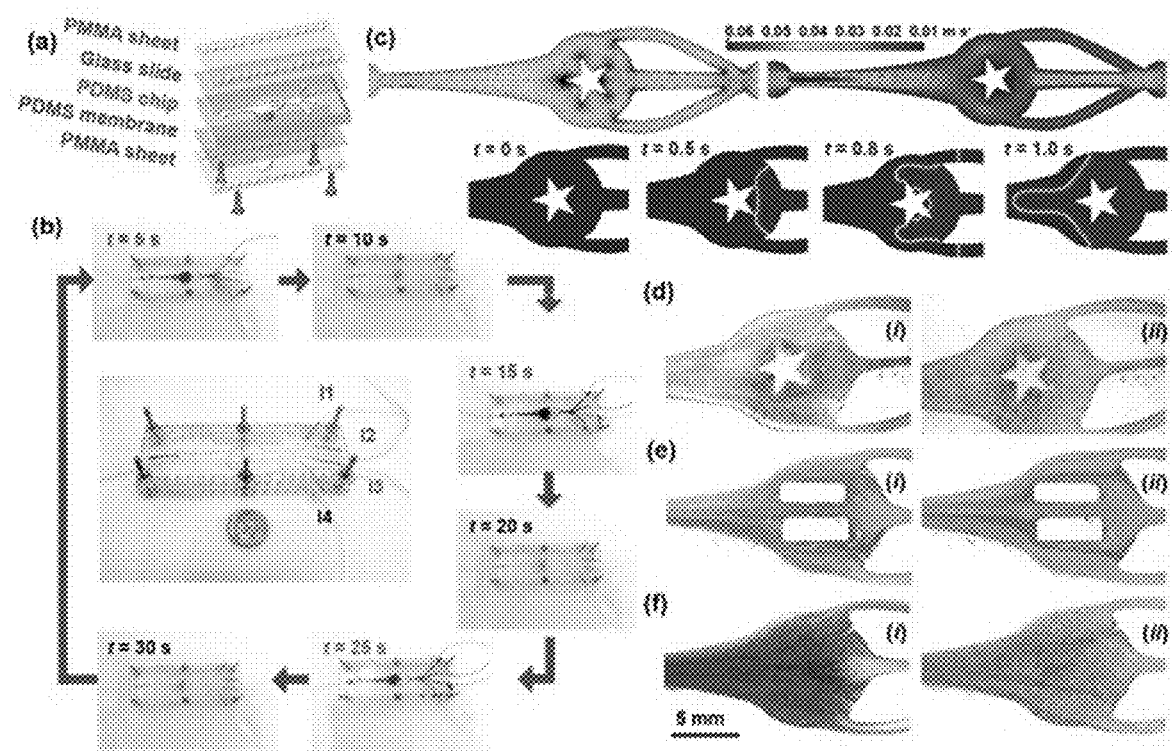
FIGS. 8a-8f provides images regarding the microfluidic chip; (a) is a schematic showing the assembly of the microfluidic chip having four inlets and one common outlet; (b) shows the operation of the microfluidic device for consecutive injection of different bioinks and the washes in between the injections; (c) shows the defined computer fluid dynamics (CFD) model and the velocity profile (m/s) of PEGDA (with a density 1.06 kg/m$^3$ and a viscosity 1×10$^{-5}$ Pa s) in the closed chamber under sinusoidal fluid flow; (d)-(f) show the role of mixing and washing observed by flow streamlines in GeIMA solution (15% w/v) mixed by food dye in the microfluidic chip for a star pattern, two rectangular patterns (made of PMMA molds), and no pattern, respectively.
Figures 9A, 9B, 9C:
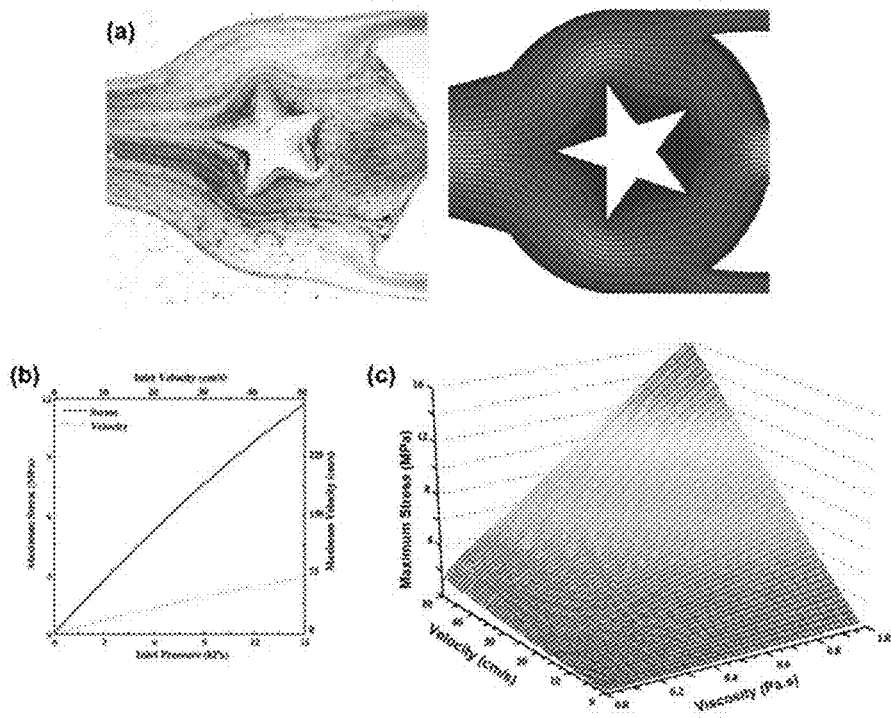
FIGS. 9a-9c provides images and data regarding the star shape in the microfluidic chip; (a) shows a comparison of experimental flow contours (left) and CFD result for velocity contours (right) around a star shape in the microfluidic chamber; (b) shows maximum stress and velocity values around the star shape versus inlet pressure and velocity in the first channel. (c) shows maximum stress values versus both inlet velocity and fluid viscosity.

Different from existing DMD bioprinters, a unique microfluidic device was developed to turn the system into a multi-material stereolithographic bioprinting platform. FIG. 8 illustrates the design of the microfluidic device consisting of one PDMS chamber held between two PMMA sheets and four inlets, which allowed for sequential injection of different bioinks (FIG. 8b). The three branches in the middle region were introduced to widen the directionality of the washing flow and reduce flow forces imposed on the printed construct (as seen by experimental observations in FIG. 8). Bioink flow filled the chip in a few seconds, before subjecting to UV crosslinking. Phosphate-buffered saline (PBS) then washed away the first bioink within the same time frame, and this was repeated for the second and following bioinks. In addition, chip performance was assessed by tracking dye particles in dye-filled bioink flows within the microfluidic device and washing by the subsequent bioink (in a different color), or PBS. FIG. 8*c* shows the simulation of our numerical model for flow patterns around the star shape, indicating a close similarity (correlation coefficient >0.70) in the flow patterns observed around the star shape (FIG. 9); left image versus right image). FIGS. 8*d-f* provide a direct visual impression on how the bioinks were washed when different shapes were printed inside the chamber. Despite the presence of branching and potential turbulence at edges, reasonable laminar flow in the printing region was able to be observed with a high-speed digital camera. As expected for micro-channels, the viscous bioink was reaching to the printing region in a laminar regime (Re ~10-100), which allowed smooth transition between sequential bioink injections. However, the shape of printed construct restricted the velocity and duration of bioink feeding. The bioink could be easily washed by the subsequent flow in the case of straight lines (FIG. 8*e*), in the absence of any dead zone or low-speed streamlines in the flow (e.g., washing time ~5 s at an inlet velocity of 1 cm s$^{-1}$). In contrast, flow patterns in the case of star shape showed low-speed streamlines inside the cavities that hampered the washing process, thus requiring bioink flow at higher speed or longer time (e.g., washing time ~20 s at an inlet velocity of 1 cm s$^{-1}$). When there was no object present in the chamber the flow pattern was smooth (FIG. 8*f*); e.g., washing time ~2 s at an inlet velocity of 1 cm s$^{-1}$). Moreover, it was investigated how the inlet pressure, regulated by nitrogen tank, and the bioink viscosity could control maximum stress applied on the printed gel with a star shape (selected as a standard here). As summarized in FIG. 9*b-c*, both stress and fluid velocity values are linearly correlated by inlet pressure or inlet velocity. This may allow the prevention of gel displacement by high shear stresses.

Figures 10A, 10B, 10C, 10D, 10E, 10F, 10G:
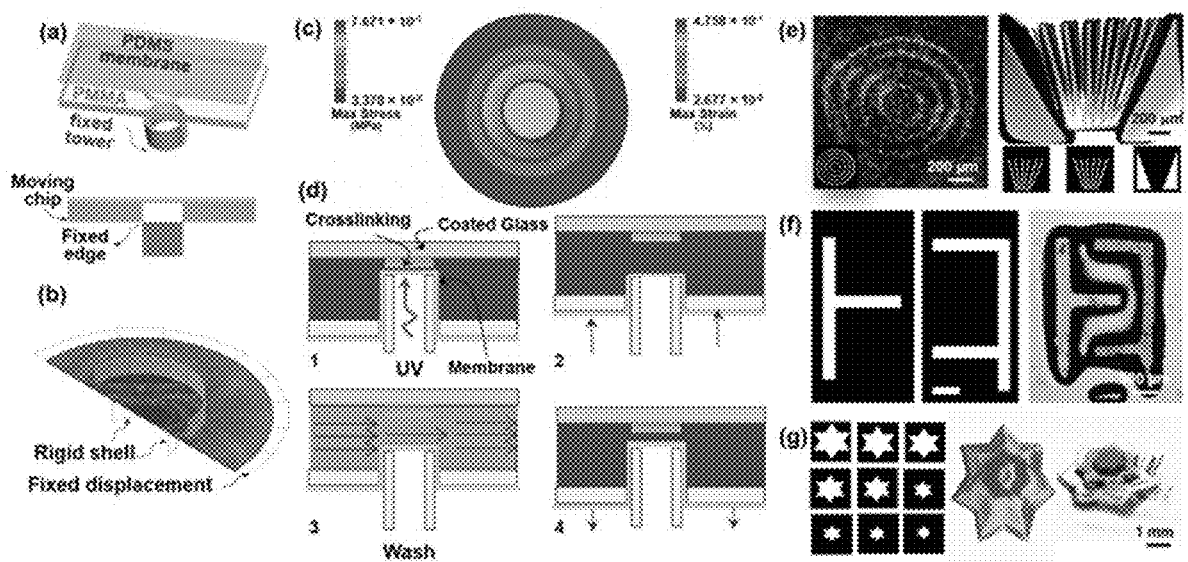
FIGS. 10a-10g shows one way in which the printing system can operate; (a) is a schematic showing the microfluidic chip containing a moving part at the center of the bottom chamber; (b) shows the computational domain of the finite element analysis built for an isotropic, incompressible, hyperelastic membrane supported on the rigid piston; (c) provides a simulation result showing principle strain and stress values of the PDMS membrane at 4-mm displacement; (d) provides schematics showing the four-step bioprinting process inside the microfluidic chip for fabricating 3D objects; (e)-(g) show examples of multi-component bioprinted constructs: (e) a two-component GeIMA-7% construct filled by fluorescent dyes (left) and a three-component pattern of colored PEGDA-50% (right); (f) a 3D fluidic mixer made by three different colors printed from PEGDA-50%; and (g) a single-component and a three-component star-shaped pyramid of PEGDA-50%.
Figures 11A, 11B, 11C:
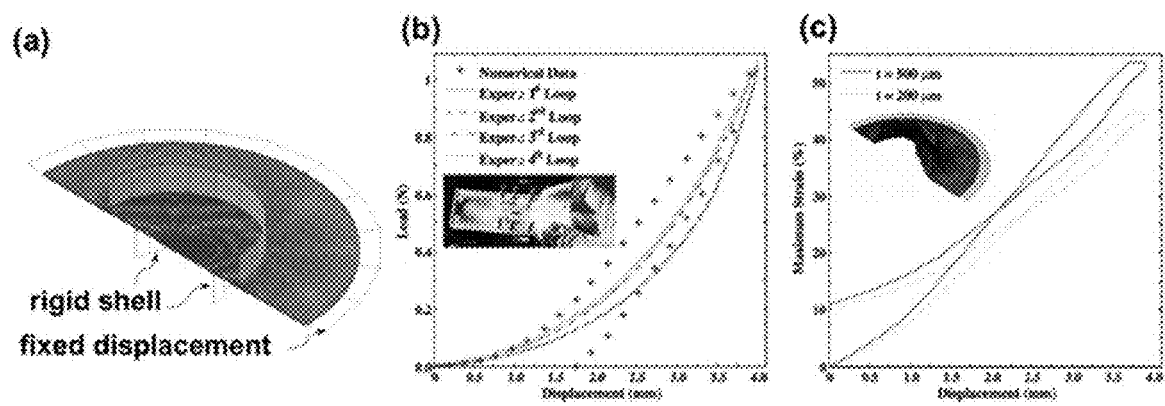
FIGS. 11a-11c provides graphs regarding the PSMA membrane; (a) provides a computational domain of the finite element analysis built for the PDMS membrane; (b) shows experimental and numerical histories of normal load (applied by the piston on the PDMS membrane) and displacement of the piston; (c) shows the numerical estimation of maximum strain that occurred in the PDMS membrane for two different thicknesses.

An elastomeric membrane made of PDMS was built into the microfluidic chip. The elastomeric membrane undergoes deformation during the bioprinting process to allow for the construction of 3D objects in conjunction with programmed injection of bioinks (FIG. 10*a-b*). Starting from the first layer of crosslinking, the microfluidic chip moves up and this movement yields reduced deformation on the membrane, until its resting position (i.e., for a 5-mm-high printed construct). The resilience of the membrane was studied through numerical simulation and customized mechanical testing, as summarized in FIGS. 10*c* and 11. The hyperelastic Neo-Hookean model[19] was used to simulate the deformation field and stress distribution of the PDMS membrane for the imposed boundary conditions (FIG. 11). The maximum deformation was under 50% strain when the chip was set at the initial position and it occurred at the contact region between the membrane and the rigid shell for the range of membrane thickness (from 200 μm to 500 μm). The central regions had uniform strains lower than 50%, thus the deformation field is still within the elastic (i.e., reversible) range of PDMS. Uniaxial tester was then employed to obtain load-displacement history of the membrane under vertical movements of the rigid shell (FIG. 11), where load-displacement curves showed hysteresis response depicting the role of friction forces on the membrane function. The membrane was programmed to load-unload when the chip was filled for printing each layer and subsequent washing, as depicted in FIG. 10*d*; however, it was found that the presence of friction forces that yielded residual strain to a certain degree limited the number of cycles for membrane deformation, requiring future optimization for printing a very high number of layers. The membrane was manually tightened after each construct when a relatively small thickness was printed and removed from the microfluidic chip. To the end, for printing large numbers of layers in a single construct such residual strain may become an issue requiring further optimizations. It should be noted that the elastomeric membrane functions to seal the microfluidic chamber during the exchange of the different bioinks while providing the ability of 3D bioprinting through layer-by-layer photocrosslinking. In comparison, in a conventional DMD or DLP setup, the open-chamber design would not allow for efficient injection or washing of the bioinks, and is therefore prohibitive of multi-material stereolithographic bioprinting.

The performance of the membrane was validated using a numerical model. The thickness of the PDMS membrane was in a range of 200-500 μm and it was subjected to movements of the tubular piston in a range of 0-4 mm. The elasticity of the PDMS membrane was obtained using Instron tensile tester (Instron, model 3300) and fit with an incompressible Neo-Hookean model. The simulation was computed using FEA software (Abaqus-version 6.10, HBK, Pawtucket, RI). FIG. 10*b* demonstrates the boundary conditions applied for numerical modeling of the membrane deformation in axisymmetric coordinate system. The upper surface of the membrane was supported by a rigid piston while a tubular piston was pushing the membrane from the bottom. To mesh the membrane geometry, quadrilateral axisymmetric hybrid elements (CAX4H element type) were employed from the Abaqus/Standard library. The large displacement theory was used for formulations where the role of nonlinear effects of the large displacements in membrane elements were included. Full Newton approach together with a symmetric solver were utilized to solve the finite elements equations. The results are summarized in FIG. 10 and FIG. 11.

The capability of the bioprinter in generating two-dimensional (2D) and 3D constructs was demonstrated. Simple shapes with different materials were bioprinted using PEGDA (50% v/v) and GelMA (7% w/v) solutions, containing 2, 3, and 4 colored bioinks (FIG. 10*e-g*). Constructs could also be fabricated in different shapes, such as eccentric circles, parallel and oblique stripes, and pyramids of different base-shapes (see also FIGS. 7 and 12). The planar printing resolution demonstrated the capacity of our bioprinting platform, while 3D bioprinting resolution was hampered by UV light scattering. It is noted that, while different bioinks were sequentially injected into the microfluidic chip, there was no obvious sign of mixing, indicating successful washing of bioinks prior to crosslinking, indicating the good performance of the elastomeric membrane in the microfluidic chip.

Figures 13A, 13B, 13C:
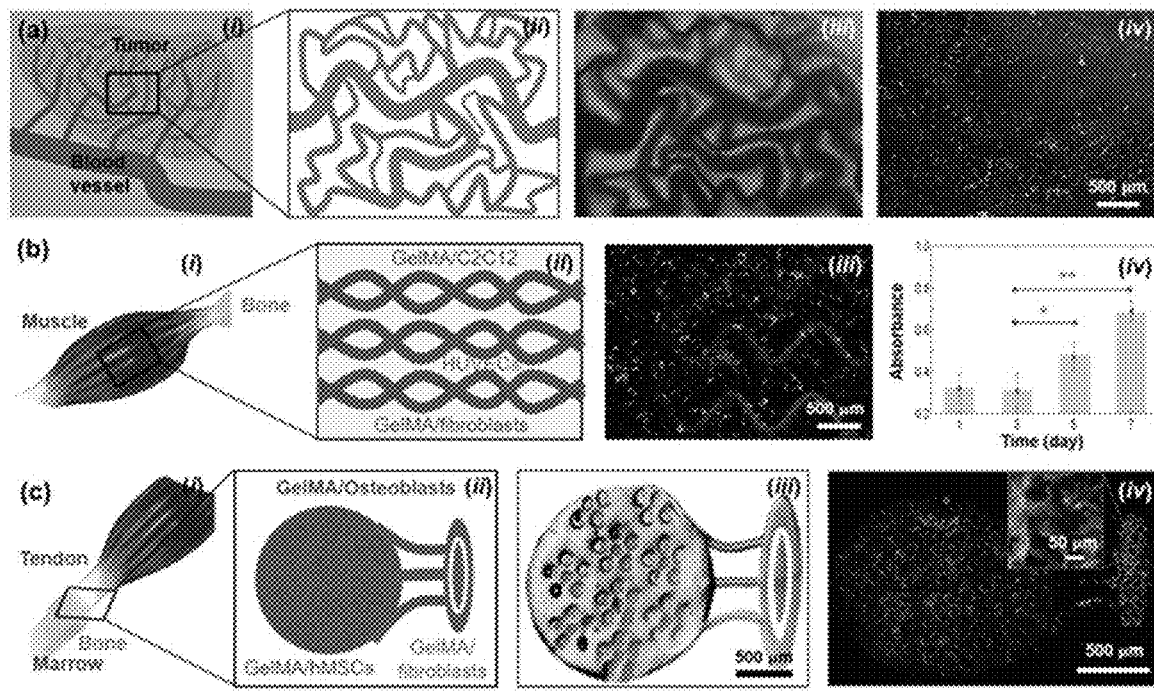
FIGS. 13a-13c shows schematics and corresponding printed constructs; (a) shows a tumor angiogenesis model: i) schematic showing the tumor angiogenesis; ii) schematic of the mask for printing; iii) bioprinted microvasculature in PEGDA; iv) bioprinted MCF7 breast tumor cells-laden microvascular bed of GeIMA further seeded with HUVECs in the channels; (b) shows a skeletal muscle model: i) schematic showing the skeletal muscle tissue; it) schematic of the mask for printing; iii) bioprinted structure of GeIMA containing patterned C2C12 cells and fibroblasts after 48 h of culture; iv) Presto Blue measurements of cell proliferation in the bioprinted structures; (c) shows a tendon-to-bone insertion model: i) schematic of the tendon-to-bone insertion site; ii) schematic of the mask for printing; iii) bright-field optical micrograph showing a bioprinted dye-laden GeIMA structure; iv) bioprinted structure of GeIMA containing patterned osteoblasts, MSCs, and fibroblasts.
Figures 14A, 14B:
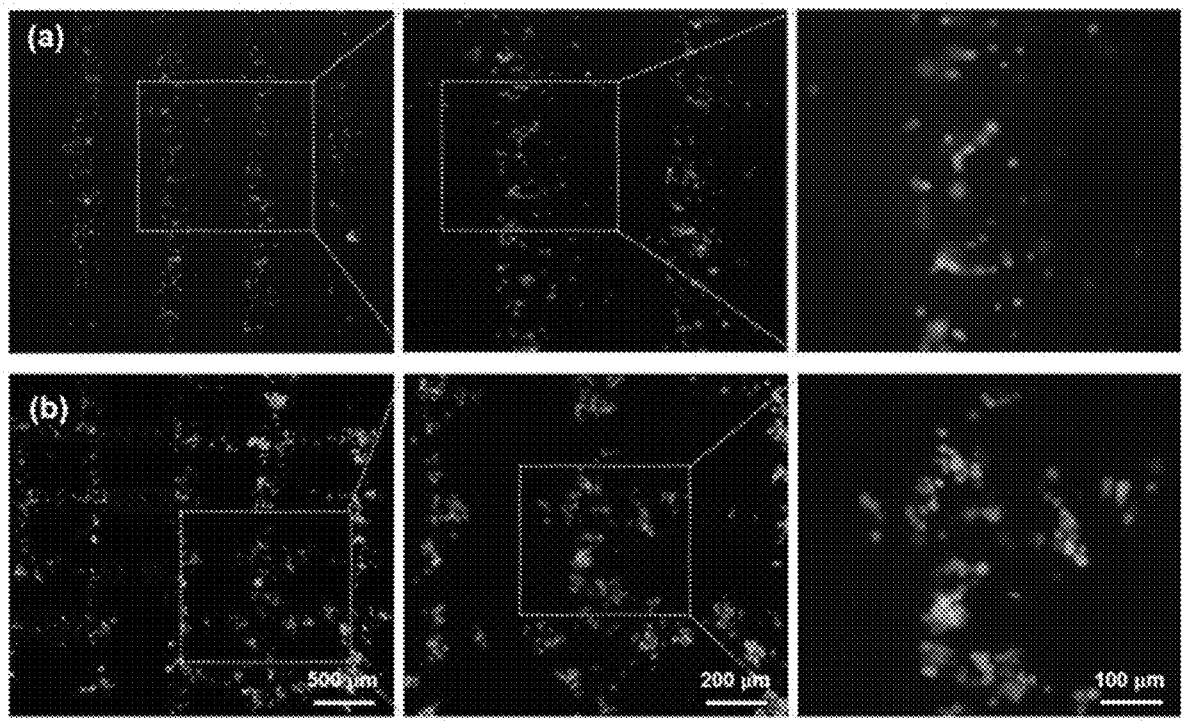
FIGS. 14a-14b shows the effects of washing on the cell viability of bioprinted NIH/3T3 fibroblast-laden GeIMA-7% patterns; (a) shows single-component parallel lines without washing; (b) shows two-component crossing networks with washing.

A set of sophisticated structures were further designed and bioprinted that resembled biological tissues such as tumor angiogenesis, muscle strips, and musculoskeletal junctions (FIGS. 13*ai, bi*, and *ci*). GelMA was used as a bioink due to its intrinsic cell adhesion moieties that promote cell spreading and functionality. Each organ-like structure had 2-4 different bioinks as each bioink was individually patterned in a rapid fashion, with smooth transitions among different bioinks. This transition that requires washing of bioink residuals in the bioprinting process can hamper cell viability as highlighted by a comparison of two different cases: single-component and two-component reticular constructs in FIG. 14.

The bioprinted structures possessed explicitly separated borders among different cell-laden bioinks, confirming the role of washing (FIG. 13). The printing resolution was determined to be approximately 20-30 μm, slightly reduced in comparison with non-cellular patterns due to scattering of photons from cellular components. Nevertheless, such a resolution is still compatible with our previous reports, suggesting that the addition of the microfluidic chip in the current system to introduce multiple bioinks did not exert noticeable effects on the DMD stereolithographic bioprinting process.

One of the current challenges in cancer biology is to understand the complex, multi-cellular cancer microenvironment. In vitro tumor cultures currently used in cancer research often result in different cell-matrix associations that in turn affect their functions; to this end, bioprinting could become a promising strategy to engineering biomimetic cancer models due to its versatility in depositing cells and matrices in precisely defined manners. Specifically, a pattern mimicking angiogenesis in a matrix of GelMA laden with scattered breast cancer cells (MCF7) was printed, followed by introduction of human umbilical vascular endothelial cells (HUVECs) within the vascular channels, as shown in FIG. 13a. Such a model, although primitive, could potentially allow studying the tumor progression and angiogenesis.

Models of the musculoskeletal systems were also fabricated using the multi-material DMD-based bioprinter. Muscle bundle-like constructs were printed using two bioinks, loaded with NIH/3T3 fibroblasts and C2C12 skeletal muscle cells. The fluorescence micrograph clearly revealed the capability of the system to print the spatially distributed cell-laden bioinks (FIG. 13bii and iii), laying down the basis for future fabrication of functional muscular tissues containing hierarchical assembly of multiple cell types. The cell viability, determined immediately and at 1 and 7 days post-bioprinting, indicated that all cell types maintained satisfactory proliferation and metabolic activity (FIG. 13biii). In addition, a construct mimicking the musculoskeletal interface integrating three different cell types, MSCs, fibroblasts, and osteoblasts was printed (FIG. 13c). Again, the printed patterns were well-defined showing relatively strong similarity with the model (FIG. 13ciii and iv versus ii).

Human umbilical vein endothelial cells (HUVECs, Lonza, Portsmouth, NH) and MSCs (Lonza) were cultured in endothelial growth medium (EGM, Lonza) and high-glucose Dulbecco's Modified Eagle Medium (DMEM; ThermoFisher, Waltham, MA), respectively. Human dermal fibroblasts, NIH/3T3 fibroblasts, MCF7 breast cancer cells and C2C12 skeletal muscle cells were obtained from ATCC (Manassas, VA) and maintained in DMEM. All media were supplemented with 10% fetal bovine serum (FBS, ThermoFisher, Waltham, MA) and 1% penicillin-streptomycin (ThermoFisher). All cells were cultured at 37° C. with 5% CO2 and passaged prior to reaching confluence.

Figures 15A, 15B, 15C, 15D:
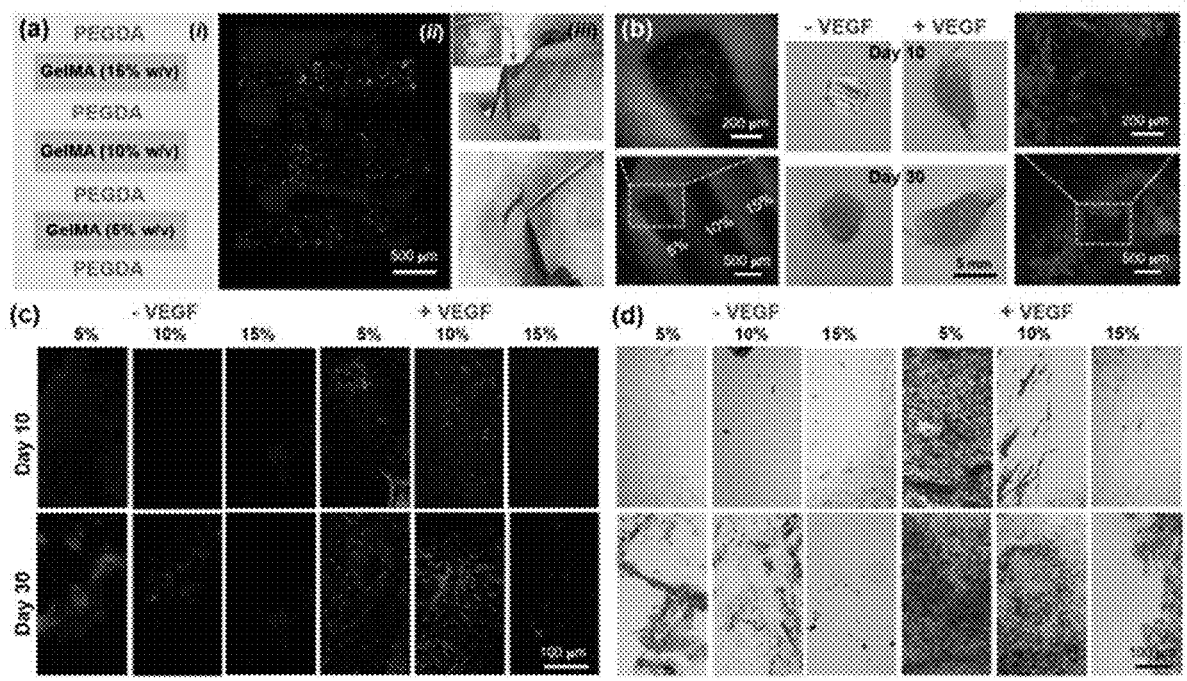
FIGS. 15a-15d provides images of a construct containing vascular endothelial growth factor (VEGF); (a) provides a concentration-gradient model generated by multi-material DMD bioprinting: i) schematic of the construct showing the PEGDA (35% v/v) frame and three GeIMA strips of 5, 10, and 15% w/v mass concentrations with a uniform thickness of 1 mm; ii) a bioprinted model where the GeIMA strips contained fluorescent beads; iii) the rat subcutaneous model used to assess the bioprinted constructs; (b) provides photographs showing the retrieved implants at Day 10 and Day 30, along with confocal images of the retrieved constructs at Day 30 stained for nuclei and for CD31; (c) shows immunostaining of the retrieved implants for CD31, for different GeIMA concentrations (5, 10, and 15%), in the absence and presence of VEGF; the nuclei were counterstained with 4',6-diamidino-2-phenylindole (DAPI); (d) shows H&E staining of the retrieved implants for different GeIMA concentrations, in the absence and presence of VEGF.

The multi-material capacity of the bioprinting platform was further assessed in vivo in a rat subcutaneous implantation model, similar to published protocols and as discussed below. (Oh et al., J. Biomater. Sci., Polym. Ed., 2012, 23, 2185). A four-material construct was designed made of PEGDA (35% v/v) as the framing structure and three GelMA strips with mass concentrations of 5, 10, and 15% w/v, respectively, as presented in FIG. 15ai. Construct with vascular VEGF loaded in the GelMA strips was used as a positive control to stimulate angiogenesis (FIG. 15aii and iii), where blank GelMA hydrogels served as the negative control. The implants were harvested at Days 10 and 30 for histological examination and their gross appearances were first assessed (FIG. 15 aiv). It has been previously reported that VEGF induces migration of multiple endothelial cell lines, such as capillary endothelium. As depicted in FIG. 15b, the presence of VEGF in the bioprinted multi-material constructs did lead to the formation of more blood vessels in the implants when compared to those without VEGF. The expressions of CD31 by the invaded cells were higher in the VEGF implants at Day 10 compared to Day 30 (FIG. 15c). These results showed that immobilized VEGF promoted the formation of the blood vessel network in the bioactive GelMA hydrogels, while the inert PEGDA served as the frame in the bioprinted multi-material structure.

In addition, VEGF seemed to have induced more pronounced inward growth of the connective tissues along the peripheries of the implants (FIG. 15b). The hematoxylin and eosin (H&E)-staining results further demonstrated the inflammatory responses of the host to the implants and recruitment of inflammatory cells, particularly at the interfaces of connective tissues and implants (FIG. 15d). The differences in CD31 expression and connective-tissue formation were less distinctive between the 5% GelMA and the 10% GelMA compared to those in the 15% GelMA (FIG. 15c-d). This may indicate that the higher concentration of GelMA (15%) prevented the invasion of cells into the implant possibly due to the denser polymer network and reduced rate of biodegradation. The in vivo study suggested the ability to fabricate heterogeneous constructs using the novel multi-material stereolithographic bioprinting strategy to regulate desired biological functions such as angiogenesis.

Animal Protocol

To test the angiogenic efficacy of the bioprinted multi-material constructs, hydrogel specimens were subcutaneously implanted in the dorsal region of 300-g male Wistar rats (Charles River Laboratories, Worcester, MA). All animal experiments were conducted according to the NIH Guidelines for the Care and Use of Laboratory Animals. Protocol was approved by the Institutional Animal Care and Use Committee of Brigham and Women's Hospital (#2017N000114). The rats were divided into 2 groups, the first group (n=6) was used as a control where hydrogel constructs without VEGF were implanted; a second group (n=6) was implanted with the multi-material constructs with increasing mass concentrations of GelMA. Before the implantation of the constructs, isoflurane inhalation (2.0-2.5% in air v/v) was used for anesthesia. After standardized aseptic animal preparation, a dorsal skin incision (2 cm) was performed to expose the subcutaneous tissue of the rat, and 3 subcutaneous pockets were created in each flank (a total of 6 subcutaneous pockets), and 1 hydrogel construct (5 mm×5 mm×1 mm in size) per subcutaneous pocket was implanted. After implantation, the incision was closed with prolene sutures (Ethicon, Somerville, NJ) and the animals were returned to their respective cages for recovery. At 10 and 30 days of implantation, 3 animals of each group were sacrificed under anesthesia overdose and the samples were extracted for further analysis. They were fixed in 10% neutral buffered formalin overnight and then serially dehydrated in ethanol (10%, 30%, 50%, 70%, 90%, and 100%). The dehydrated samples were embedded in paraffin for 48 h and sectioned in 12-μm thickness. Histology (H&E) and immunostaining against CD31 (ab182981, Abcam, Cambridge, MA) were performed to characterize cell infiltration (inflammation), tissue remodeling, and angiogenesis. The stained samples were imaged by an optical microscope (Zeiss, Oberkochen, Germany) and by a Leica SP5 X inverted confocal microscope (Leica, Wetzlar, Germany).

In summary, an innovative strategy has been demonstrated by integrating a microfluidic device into the design of a DMD-based bioprinter to achieve, for the first time, automated, multi-material stereolithographic bioprinting. In a typical process, the DMD-based bioprinting platform disclosed in this example requires only a few seconds to preform washing (if switching is required); for example, non-uniform constructs were printed, composed of 2-3 bioinks, in less than 20 s, while an industrial DMD-based printer would probably consume an additional time of 100 s simply devoted to manual bioink injections and switching. Other manually operated laboratory-scale multi-material DMD-based printers would take similar time to replace the bioinks. Therefore, the bioprinter disclosed herein could achieve a speed faster than those of the existing stereolithography and/or DMD-based platforms.

The advantage of the bioprinting platform disclosed in the instant example in terms of fabrication speed will become more noticeable when fabrication time hampers cell viability in larger cell-laden constructs. The unique features of this bioprinter have significantly promoted the current level of control and printing speed among existing bioprinting techniques. This concept is also expandable to as many bioinks as needed by simply increasing the number of inlet channels. In addition, the printing speed of our multi-material DMD bioprinting system may be further improved by carefully coordinating projection light and local oxygen levels to achieve continuous photocrosslinking of the bioinks in a layerless manner.

Additional Experimental Procedures

DMD-based bioprinting platform: FIG. 6a shows the custom-built DMD-based bioprinting system used for the fabrication of multi-component constructs. A UV LED (M385LP1-C1; Thorlabs, Newton, NJ) mounted to a light collimator was used at a wavelength of 365 nm and a power of nearly 500 mW/cm². A Newport (Nashua, NH) power meter was used to determine the light intensity. Our digital models built with AutoCAD were converted to 2D bitmap slices and translated to spatially tilt a pattern of micromirrors on the DMD panel (DLP® LightCrafter™ 6500; Texas Instruments Inc., Dallas, TX). A stage controller was used to manage the three-axis stage movement, whereas the UV light source (Thorlabs) was directed via an optical path towards the DMD panel at a specific angle to facilitate light reflection through the projection optics to the stage. The thickness of the layers could be adjusted in 100-μm steps and the planar resolution of the system was found to be around 10 μm (5×5 mm illumination area). This resolution was achieved utilizing a compound lens with 2-cm working distance (FIG. 6b). Since the DMD reflects an array of square pixels and the layers are built on top of each other, the tolerance of the printing is important in the resolution of constructs [16]. Exposure times ranged from 1 to 20 s depending on the aperture of light and hydrogel composition. The DMD panel, the stage, and the UV light source were controlled by a microcontroller (Arduino UNO; Arduino, Italy). FIG. 8b shows the printing sequence controlled by the Arduino program. While the pattern is being printed there is no liquid flowing in the chamber (stage 1 in FIG. 10d); once the pattern is printed, the motor brings the chip up (stage 2 in FIG. 10d); if the material is to be changed, the valve of the next material is turned on and the new material starts washing the one currently in the chamber (stage 3 in FIG. 10d); an additional washing with buffer can be added if the material is hard to wash; finally, the motor brings the chip down to print the following layer. An open chamber shown in FIG. 6c was also used to test single-material printing and characterize the optical setup.

Optical configuration. The optical setup of the DMD-based bioprinting system (FIG. 6b) comprised of a UV lamp (M385LP1-C1; Thorlabs, Newton, NJ), a DMD chipset (1050×920, DLP6500; Texas Instruments, Austin, TX), a Keplerian optical setup (Thorlabs), and a microscope objective (20×; Mitutoyo, Kanagawa, Japan). The optical beam path can be described as follows: a uniform beam of light departing from the UV LED mounted to light collimator is used at a wavelength of 385 nm and 1.650 mW. The UV beam (f=57 mm) is reduced using a Keplerian optical setup (f=150 mm for UV-fused silica Plano convex lens and f=12.7 mm for UV bi-concave lens) with the aim of increasing the light intensity and cover full area of the DMD chipset (10 mm×12 mm). The resulting beam subsequently impinges upon the DMD chipset in which different light patterns, controlled using CAD, can be generated. Using a microscope objective (Mitutuyo) the selected pattern from the DMD chipset was focused at a distance corresponding to the focal length of the microscope objective (2 mm). This distance was considered the working distance where the photosensitive hydrogel or polymer crosslinks can be exposed to UV light to create the complex cell-laden constructs.

Figures 12A, 12B, 12C:
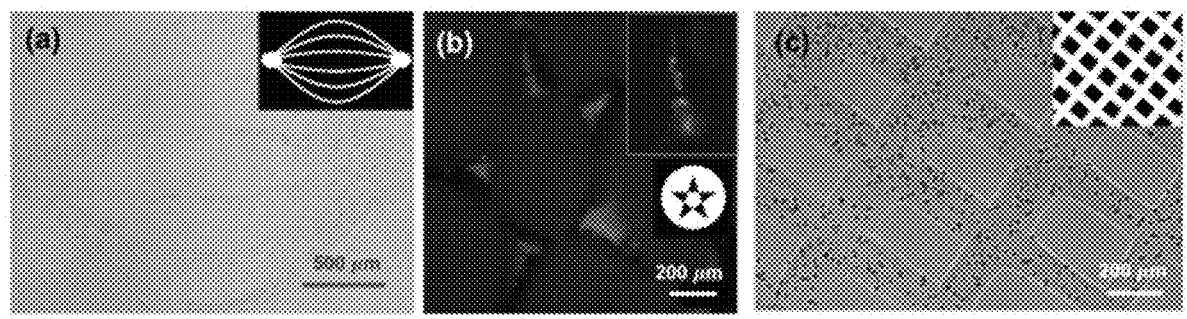
FIGS. 12a-12c provides examples of cell patterning; (a) shows a muscle stripe-like shape: C2C12 skeletal muscle cells-loaded GeIMA-7% immediately after bioprinting; (b) shows a star shape: mesenchymal stem cells (MSCs) printed in a PEGDA-50% pattern after 24 h; (c) shows a reticular network made by osteoblast-loaded GeIMA-7% immediately after bioprinting. The designed mask is shown for each case.

Hydrogel preparations: PEGDA (Mn=700), 2,2,6,6-tetramethylpiperdine 1-oxyl (TEMPO), and gelatin from porcine skin type A were purchased from Sigma-Aldrich (St. Louis, MO). TEMPO mitigates free radical migration distance leading to structure sharpness in high-aspect ratio constructs. High-purity distilled water was generated by Millipore system with a resistivity reading of 18.2 Ma upon collection. Lithium phenyl-2,4,6-trimethyl-benzoyl-phosphinate (LAP) was purchased from BioBots (Philadelphia, PA). This photoinitiator has been extensively used for cellular studies. A 50% v/v PEGDA aqueous solution was prepared, and TEMPO (0.01% w/v) and LAP (1.0% w/v) were added to the solution. The mixture was heated to 80° C. for 1-3 h. The resulting PEGDA bioink was used to fabricate the structures presented in FIG. 7. Food dyes and fluorescence beads were used to assist visualizations when necessary. For 3D constructs and cell study we used GelMA-7% w/v solution containing LAP (0.3% w/v), as shown in FIG. 12. GelMA was also fabricated following well-established protocol. In summary, gelatin was dissolved in PBS for 2 h at 60° C. under constant stirring to make a 10% w/v gelatin solution and then added 5% v/v methacrylic anhydride (Sigma-Aldrich), and subsequently stirred for 1 h at 60° C. and 500 rpm. Two volumes of pre-heated PBS were added and the solution was dialyzed for one week.

Multi-inlet microfluidic chip: The microfluidic chip of the bioprinting platform (FIGS. 6a and 8a) was designed and fabricated. The chip model was designed using CorelDraw (Corel Corp, Ottawa, ON) software and imported to a laser cutting machine (VLS 2.30 Desktop Laser, Universal Laser Systems Inc, Richmond, VA) for cutting PMMA sheets (1.6 mm in thickness; McMaster-Carr, Robbinsville, NJ). The mold included four 1-mm-wide inlets, connecting channels, one printing region of 10 mm in diameter, and one outlet. After merging the four inlets, the first semi-circular region was 4 mm wide and it connected to a short 2-mm-wide channel. A smooth connection to the printing region was designed with three curved branches so that the hydraulic resistance of each branch was approximately one-third the hydraulic resistance of one single channel. The four inlets were merged into a wider region (4 mm in width) with a total length of 5 mm. PDMS precursor (Sylgard 184; Dow Corning, Midland, MI), prepared by an elastomer/curing agent ratio of 10:1, was poured onto the PMMA mold, cured at 85° C. for 2 hr, and peeled off. A circular region assigned for printing was created using a customized punch (outer diameter: 10 mm) in the center of the PDMS chamber. Our design also included a thin PDMS membrane; spin coating was used (at 1000 rpm) of a PDMS drop on a glass slide, followed by curing at 85° C. for 2 hr, to achieve this membrane. The patterned PDMS replica was manually bonded to the membrane and then sandwiched between two PMMA sheets, as depicted in FIG. 8a. To connect the inlets and outlet, stainless steel adaptors (outer diameter: 0.5 mm) were used.

Flow characterization of the microfluidic chip. A pressure-driven design was chosen using a combination of compressed nitrogen gas, pneumatic valves, syringe-based reservoirs, and Tygon medical tubing (FIG. 8b). Flow controllers (National Instruments, Woburn, MA) were connected to a nitrogen tank to provide the desired input pressure (0-25 psi). Standard 5-mL syringes were modified to be pushed by compressed nitrogen and attached to 20G needles on the other side. We first characterized flow mixing and washing using PEGDA-50% solutions with different colors (food dyes) and PBS for washing. FIG. 8b-c shows the performance of the chip in terms of proper washing after each dye. To evaluate the flow effect on printed patterns and washing mechanism, a series of numerical simulations were performed. To validate the simulation, a high-viscosity gelatin solution (at 37° C.) was utilized to capture flow streamlines. The fluorescence micrographs at nine different fluidic path lengths for each microchannel were acquired using a complementary metal oxide semiconductor (CMOS) camera (Flea3.0; Point Grey, Vancouver, Canada). In addition, to evaluate the mixer performance, the residence time was characterized by injecting red, blue, and green bioinks at each inlet and recording the color changes.

Computation fluid dynamic (CFD) simulation was used to demonstrate how fluid manipulation could enable washing non-crosslinked bioinks from the crosslinked hydrogels. The CFD simulation was performed using a software (COMSOL Multiphysics; finite element scheme). The chip geometry was imported from the CorelDraw software to COMSOL in DXF format. The initial observations (Video S1) confirmed that the flow of PEGDA was laminar. A physics controlled triangular mesh was selected, for case of laminar flow and physical properties of PEGDA-50% and PEGDA-10% (density: 1.12 g/cm3; viscosities: 30 to 1000 cP) were used for the computations. Assuming time-independent (i.e. steady-state) conditions, the flow was simulated for 4 s (40 time steps) to ensure proper washing of two-material simulation. The Reynolds number (0 to 10) confirmed the laminar flow. Cartesian coordinates (Z out of plane) were selected to define out computational model. The symmetry line Y=0, where the vertical velocity is zero, simplified our computations to half-geometry. The channel walls as well as the fluid-solid interface of patterned shapes (e.g. star) were all defined as no-slip boundary conditions. The input was defined as fluid velocity, while for the washing step we defined the presence of fluid I in all channel and then fluid II at the inlet. Finally, for the case of 3D, a tetrahedral mesh was used along with fully coupled solver (and partially coupled) at extremely slow time rate (>1 hr per time step) for reasonable washing speed for laminar flow (FIG. 8).

From the above description, those skilled in the art will perceive improvements, changes and modifications. Such improvements, changes and modifications are within the skill of one in the art and are intended to be covered by the appended claims.

All patent applications, patents, and printed publications cited herein are incorporated herein by reference in the entireties, except for any definitions, subject matter disclaimers or disavowals, and except to the extent that the incorporated material is inconsistent with the express disclosure herein, in which case the language in this disclosure controls.

What is claimed is:

1. A method of printing a multi-material 3D construct comprising:
   providing a plurality of inks;
   releasing at least one first ink into a microfluidic chip wherein the microfluidic chip comprises (i) a chamber, wherein the chamber further comprises a printing region for holding the ink to be printed; (ii) a deposition layer, and (iii) an elastic membrane;
   causing the elastic membrane to deform;
   photocrosslinking the first ink in the printing region onto the deposition layer to form a first printed layer;
   reducing the deformation of the elastic membrane;
   washing the chamber; and
   releasing at least one second ink into the microfluidic chip to produce a second printed layer.

2. The method of claim 1, wherein the chamber is washed using the second ink.

3. The method of claim 1, wherein the chamber is washed using a buffer.

4. The method of claim 1, wherein one of the first or second inks comprise a biologically active component, wherein the biological active component is selected from biomaterials, cells, growth factors, cytokines, anti-infection agents, adhesive molecules, and nanoparticles.

5. The method of claim 1, wherein the first and second inks comprise a biologically active component, wherein the biological active component is selected from biomaterials, cells, growth factors, cytokines, anti-infection agents, adhesive molecules, and nanoparticles.

6. The method of claim 1, wherein two first inks are released into the microfluidic chip.

* * * * *